United States Patent
Zhou

(10) Patent No.: US 9,391,605 B2
(45) Date of Patent: Jul. 12, 2016

(54) DISCHARGE CIRCUIT FOR POWER SUPPLY UNIT

(71) Applicants: HONG FU JIN PRECISION INDUSTRY (ShenZhen) CO., LTD., Shenzhen (CN); HON HAI PRECISION INDUSTRY CO., LTD., New Taipei (TW)

(72) Inventor: Hai-Qing Zhou, Shenzhen (CN)

(73) Assignees: HONG FU JIN PRECISION INDUSTRY (ShenZhen) CO., LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 383 days.

(21) Appl. No.: 14/141,401

(22) Filed: Dec. 26, 2013

(65) Prior Publication Data

US 2014/0175902 A1 Jun. 26, 2014

(30) Foreign Application Priority Data

Dec. 26, 2012 (CN) .................. 2012 1 05729358

(51) Int. Cl.
*H02J 1/00* (2006.01)
*H03K 17/284* (2006.01)

(52) U.S. Cl.
CPC ......... *H03K 17/284* (2013.01); *H02J 2001/008* (2013.01); *Y10T 307/76* (2015.04)

(58) Field of Classification Search
CPC ................................ H02J 2001/008
USPC .......................................... 307/125, 139–140
See application file for complete search history.

(56) References Cited

U.S. PATENT DOCUMENTS

| 8,195,963 B2* | 6/2012 | Zhou | G06F 1/26 713/1 |
| 8,405,246 B2* | 3/2013 | Hung | G06F 1/26 307/31 |
| 8,410,842 B1* | 4/2013 | Bai | G06F 1/26 327/427 |
| 2009/0160545 A1* | 6/2009 | Hu | H02J 9/06 327/581 |
| 2010/0007400 A1* | 1/2010 | Zou | H03K 17/6264 327/407 |
| 2010/0100753 A1* | 4/2010 | Zou | G06F 1/266 713/323 |
| 2010/0211811 A1* | 8/2010 | Zhou | G06F 1/26 713/330 |
| 2010/0223485 A1* | 9/2010 | Zou | G06F 1/26 713/340 |
| 2010/0306562 A1* | 12/2010 | Chen | G06F 1/26 713/323 |
| 2011/0121657 A1* | 5/2011 | Zhou | G06F 1/26 307/80 |
| 2014/0175903 A1* | 6/2014 | Zhou | H03K 17/284 307/115 |

* cited by examiner

*Primary Examiner* — Adi Amrany
(74) *Attorney, Agent, or Firm* — ScienBiziP, P.C.

(57) ABSTRACT

A discharge circuit for a power supply unit includes a pulse width modulator (PWM) chip, a first and second electronic switch, and a resistor. The first electronic switch receives a power good signal from the power supply unit. When a system power terminal outputs a voltage later than a stand-by power terminal, a voltage creep outputted by the PWM chip is discharged through the resistor and the second electronic switch.

9 Claims, 2 Drawing Sheets

DISCHARGE CIRCUIT FOR POWER SUPPLY UNIT

CROSS-REFERENCE TO RELATED APPLICATIONS

Relevant subject matter is disclosed in one co-pending U.S. patent application Ser. No. 14/141,403 having the same titles, which are assigned to the same assignees as this patent application.

BACKGROUND

1. Technical Field

The present disclosure relates to a discharge circuit.

2. Description of Related Art

During a power-on operation of a computer, a voltage creep may be generated when a system voltage is output later than a stand-by voltage. A resistor may be used to discharge the voltage creep. However, the resistor is still working when the computer is powered on, which wastes energy.

Therefore, there is room for improvement in the art.

BRIEF DESCRIPTION OF THE DRAWINGS

Many aspects of the present disclosure can be better understood with reference to the following drawing(s). The components in the drawing(s) are not necessarily drawn to scale, the emphasis instead being placed upon clearly illustrating the principles of the present disclosure. Moreover, in the drawing(s), like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean "at least one."

Figure 1:
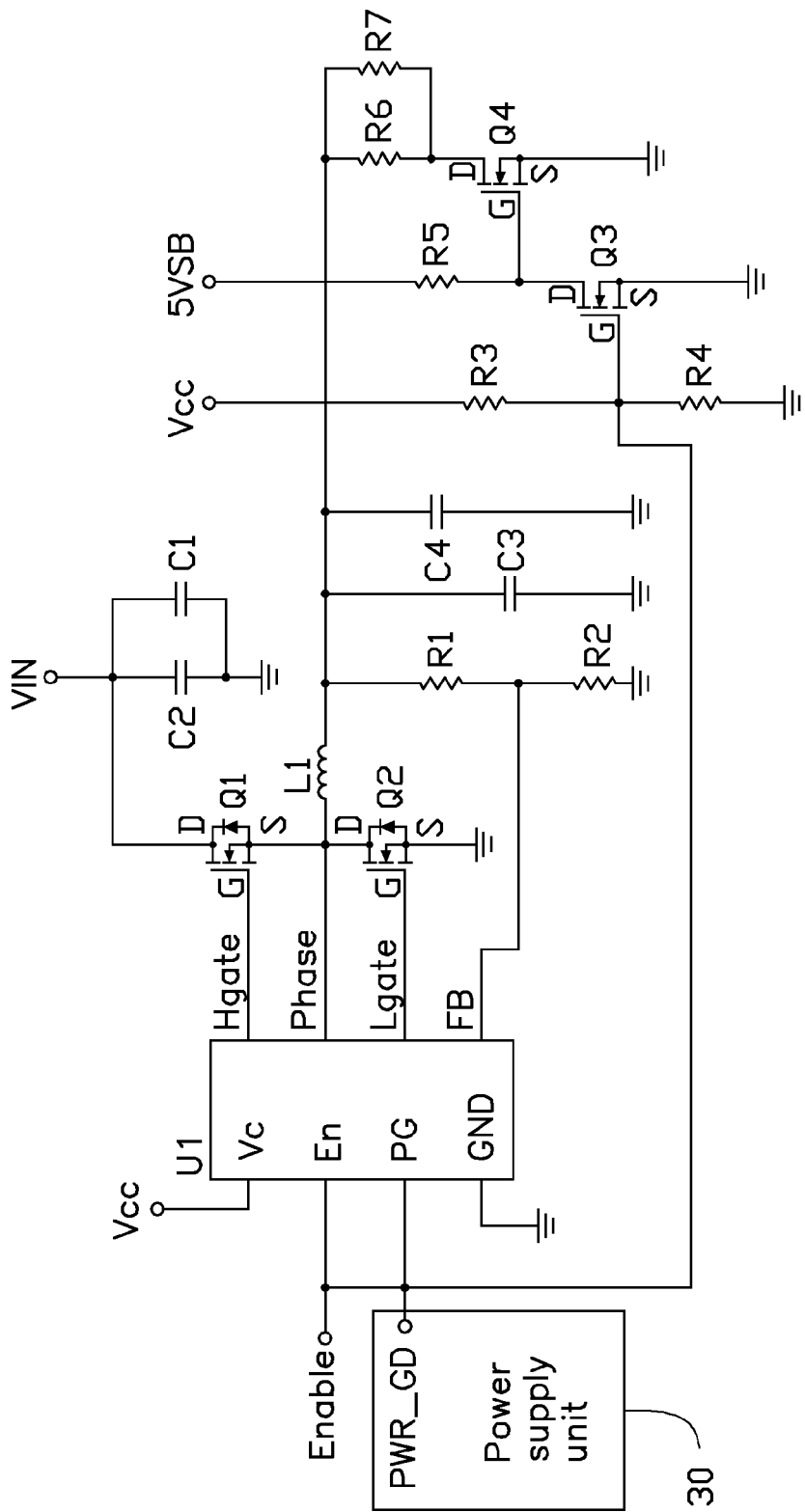
FIG. 1 is a circuit diagram of a first embodiment of a discharge circuit.

FIG. 1 illustrates a first embodiment of a discharge circuit. The discharge circuit comprises a power supply unit 30, a pulse width modulator (PWM) chip U1, four capacitors C1-C4, seven resistors R1-R7, and four transistors Q1-Q4.

A gate G of the transistor Q3 is coupled to an enable pin En and a control pin PG of the pulse width modulator (PWM) chip U1, to receive a control signal from the power supply unit 30. The gate G of the transistor Q3 is coupled to a system power terminal Vcc through the resistor R3, and is connected to ground through the resistor R4. A source S of the transistor Q3 is connected to ground. A drain D of the transistor Q3 is coupled to a stand-by power terminal 5VSB through the resistor R5, and is also coupled to a gate G of the transistor Q4. A source S of the transistor Q4 is connected to ground. A drain D of the transistor Q4 is coupled to a first terminal of an inductance L1 through the resistors R6 and R7 connected parallel. A second terminal of the inductance L1 is coupled to a phase output pin Phase of the PWM chip U1.

A voltage pin Vc of the PWM chip U1 is coupled to the system power terminal Vcc. The enable pin En is used to receive an enable signal Enable. A ground pin GND of the PWM chip U1 is connected to ground. A high gate output pin Hgate of the PWM chip U1 is coupled to a gate G of a transistor Q1. A drain D of the transistor Q1 is coupled to a power terminal VIN. The power terminal VIN is connected to ground through capacitors C1 and C2 connected parallel. A source S of the transistor Q1 is coupled to the phase output pin Phase. A low gate output pin Lgate is coupled to a gate G of a transistor Q2. A drain D of transistor Q2 is coupled to the phase output pin Phase. A source S of the transistor Q2 is connected to ground. A voltage output pin FB of the PWM chip U1 is connected to ground through a resistor R2, and is coupled to the first terminal of the inductance L1. The first terminal of the inductance L1 is connected to ground through capacitors C3 and C4 connected parallel. The control pin of the PWM chip U1 is used to receive a power good signal (PWR_GD) from the power supply unit 30.

In the embodiment, the gate G of the transistor Q3 receives the enable signal and the power good signal. During a power-on operation, the power good signal is at low-voltage level, such as logic 0, and the enable signal is at low-voltage level, if the system power terminal VCC is not outputting a system voltage, while the stand-by power terminal 5VSB outputs a stand-by voltage, the PWM chip U1 outputs a voltage creep through the phase output pin Phase. The gate G of the transistor Q3 receives the low-voltage level control signal, and the transistor Q3 is turned off, and the gate G of the transistor Q4 is at high-voltage level. Accordingly, the transistor Q4 is turned on, and the voltage creep is discharged through the resistors R6, R7 and the transistor Q4.

When the system power terminal Vcc outputs the system voltage, the power supply unit 30 outputs a high-voltage level power good signal, such as logic 1, and the enable signal is also at high-voltage level. Accordingly, the gate G of the transistor Q3 is at high-voltage level, and the transistor Q3 is turned on, and the gate G of the transistor Q4 is at low-voltage level, such as logic 0, the transistor Q4 is turned off Accordingly, the resistors R6 and R7 are no longer consuming power.

In other embodiments, only one of the power good signal or the enable signal is received by the gate G of the transistor Q3.

Figure 2:
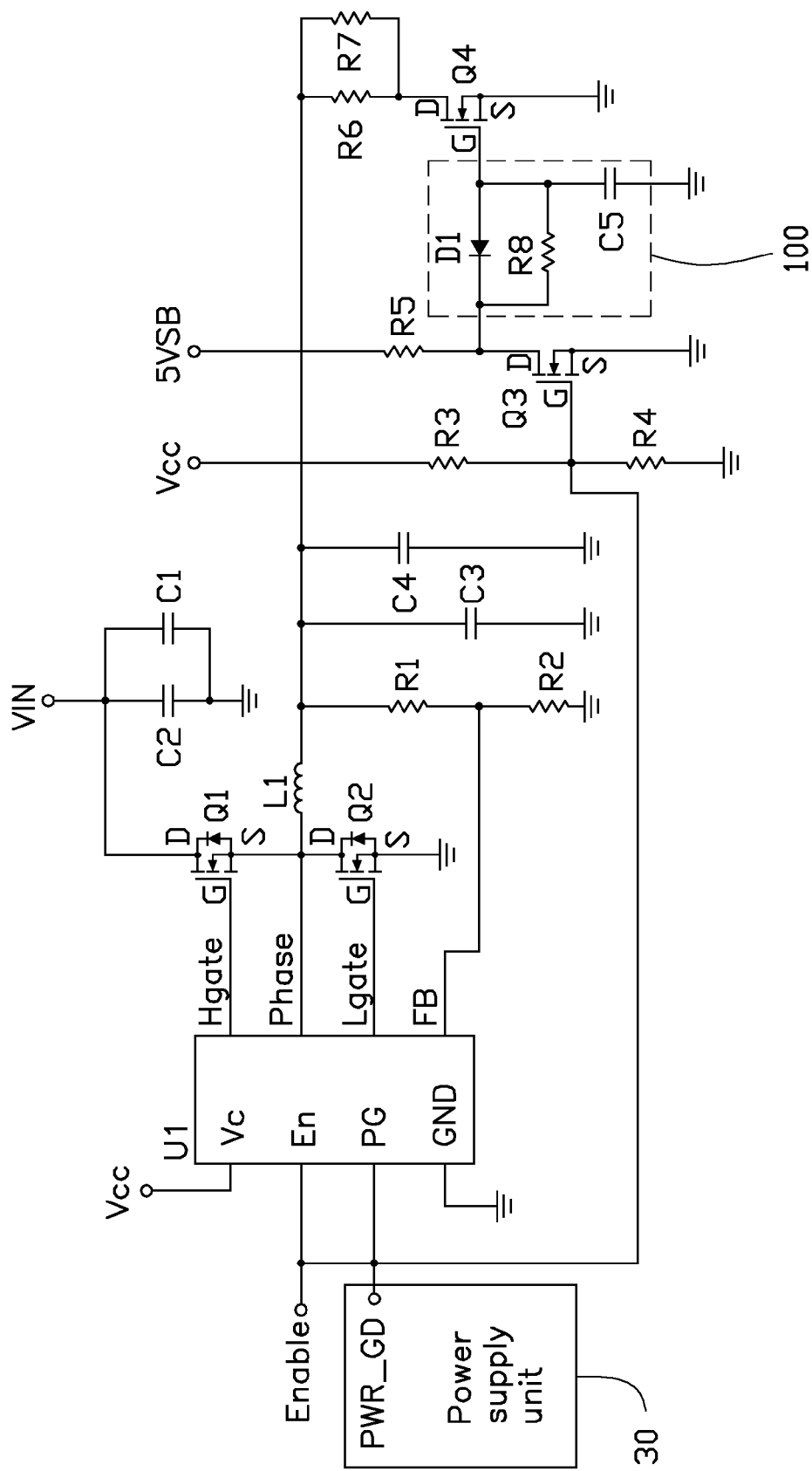
FIG. 2 is a circuit diagram of a second embodiment of the discharge circuit.

FIG. 2 illustrates a second embodiment of the discharge circuit. In comparison to the first embodiment, the discharge circuit further comprises a delay unit 100 between transistors Q5 and Q6. The delay unit 100 comprises a capacitor C5, a resistor R8, and a diode D1. A drain D of the transistor Q5 is connected to ground through the resistor R8 and the capacitor C5 in that order. The drain D of the transistor Q5 is coupled to a cathode of the diode D1. An anode of the diode D1 is coupled to a gate G of the transistor Q6, and coupled to a node between the resistor R8 and the capacitor C5.

During a power-on operation, the power good signal is at low-voltage level, and the enable signal is at low-voltage level, if the system power terminal VCC is not outputting a system voltage, while the stand-by power terminal 5VSB outputs a stand-by voltage, the PWM chip U1 outputs a voltage creep through the phase output pin Phase. The gate G of the transistor Q3 receives the low-voltage level control signal, and the transistor Q3 is turned off, and the stand-by power terminal 5VSB charges the capacitor C5. After the capacitor C5 is charged to a voltage that makes gate G of the transistor Q4 be at high-voltage level, the transistor Q4 is turned on, and the voltage creep is discharged through the resistors R12, R13 and the transistor Q6.

In the embodiment, the transistors Q1-Q6 are n-channel metal oxide field effect transistors (NMOSFET).

While the disclosure has been described by way of example and in terms of preferred embodiment, it is to be understood that the disclosure is not limited thereto. To the contrary, it is intended to cover various modifications and similar arrangements as would be apparent to those skilled in the art. Therefore, the range of the appended claims should be accorded the broadest interpretation so as to encompass all such modifications and similar arrangements.

What is claimed is:

1. A discharge circuit, comprising:
a power supply unit outputting a power good signal;
a pulse width modulator chip comprising a control pin and a phase output pin, wherein the control pin is coupled to the power supply unit, to receive the power good signal; and
first and second electronic switches each comprising first to third terminals, wherein the first terminal of the first electronic switch is coupled to the control pin, and is coupled to a first system power terminal through a first resistor, the second terminal of the first electronic switch is connected to ground, the third terminal of the first electronic switch is coupled to a stand-by power terminal through a second resistor; the third terminal of the first electronic switch is coupled to the first terminal of the second electronic switch; the second terminal of the second electronic switch is connected to ground, the third terminal of the third electronic switch is coupled to the phase output pin through a third resistor;
wherein when the first terminals of the first and second electronic switches are at low-voltage level, the first and second electronic switches are turned on; when the first terminals of the first and second electronic switches, the first and second electronic switch are turned off.

2. The discharge circuit of claim 1, further comprising a delay unit, the delay unit is coupled between the third terminal of the first electronic switch and the first terminal of the second electronic switch.

3. The discharge circuit of claim 2, wherein the delay unit comprises a fourth resistor, a first capacitor, and a diode, the third terminal of the first electronic switch is coupled to a cathode of the diode, an anode of the diode is coupled to the first terminal of the second electronic switch, the third terminal of the first electronic switch is connected to ground through the fourth resistor and the first capacitor, the anode of the diode is coupled between a node of the fourth resistor and the first capacitor.

4. The discharge circuit of claim 3, wherein the first terminal of the first electronic switch is coupled to ground through a fifth resistor, the phase output pin is coupled to a first terminal of a inductance, a second terminal of the inductance is coupled to the third terminal of the second electronic switch through the third resistor and a fifth resistor connected parallel.

5. The discharge circuit of claim 4, wherein the first terminal of the first electronic switch is further coupled an enable pin of the PWM chip, to receive an enable signal.

6. The discharge circuit of claim 5, wherein the PWM chip further comprises a high gate output pin, a low gate output pin, and a voltage output pin, the high gate output pin is coupled to a first terminal of a third electronic switch, a second terminal of the third electronic switch is coupled to the phase output pin of the PWM chip, a third terminal of the third electronic switch is coupled to a second power terminal, the second power terminal is connected to ground through a second capacitor; the low gate output pin of the PWM chip is coupled to a first terminal of a fourth electronic switch, a second terminal of the fourth electronic switch is connected to ground, the third terminal of the fourth electronic switch is coupled the phase output pin; the voltage output pin is coupled to the second terminal of the inductance through a sixth resistor, and is connected to ground through a seventh resistor.

7. The discharge circuit of claim 6, wherein the second terminal of the inductance is connected to ground through a fourth capacitor.

8. The discharge circuit of claim 7, wherein the second terminal of the inductance is connected to ground through a fifth capacitor.

9. The discharge circuit of claim 8, wherein the first to fourth electronic switches are n-channel metal oxide field effect transistors (NMOSFET), the first terminals, the second terminals, and the third terminals of the first to fourth electronic switches are gates, sources, and drains of the NMOSFET.

* * * * *